(12) United States Patent
Liu

(10) Patent No.: US 10,018,878 B2
(45) Date of Patent: Jul. 10, 2018

(54) ARRAY SUBSTRATE AND DISPLAY DEVICE

(71) Applicants: Boe Technology Group Co., Ltd., Beijing (CN); Chengdu Boe Optoelectronics Technology Co., Ltd., Sichuan (CN)

(72) Inventor: Xu Liu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 14/913,328

(22) PCT Filed: Jul. 17, 2015

(86) PCT No.: PCT/CN2015/084336
§ 371 (c)(1),
(2) Date: Feb. 19, 2016

(87) PCT Pub. No.: WO2016/150040
PCT Pub. Date: Sep. 29, 2016

(65) Prior Publication Data
US 2017/0038648 A1 Feb. 9, 2017

(30) Foreign Application Priority Data

Mar. 20, 2015 (CN) .......................... 2015 1 0125793

(51) Int. Cl.
*H01L 27/14* (2006.01)
*G02F 1/1343* (2006.01)
(Continued)

(52) U.S. Cl.
CPC ...... *G02F 1/134327* (2013.01); *G02F 1/1368* (2013.01); *G02F 1/136286* (2013.01);
(Continued)

(58) Field of Classification Search
CPC ...................................................... G02F 1/1368
See application file for complete search history.

(56) References Cited

U.S. PATENT DOCUMENTS

| | | | |
|---|---|---|---|
| 2003/0090603 A1* | 5/2003 | Chae | G02F 1/1368 349/43 |
| 2005/0030461 A1* | 2/2005 | Ono | G02F 1/133345 349/141 |

(Continued)

FOREIGN PATENT DOCUMENTS

| | | |
|---|---|---|
| CN | 102713747 | 10/2012 |
| CN | 202916564 | 5/2013 |

(Continued)

OTHER PUBLICATIONS

Office Action from China Application No. 201510125793.4 dated Jan. 19, 2017.

(Continued)

*Primary Examiner* — Vongsavanh Sengdara
(74) *Attorney, Agent, or Firm* — Calfee, Halter & Griswold LLP

(57) ABSTRACT

The embodiments of the present invention provide an array substrate and a display device, relate to the field of electronic technology and reduce the problem of color shift occurred in the display device to a certain degree. The solution comprises: a first pixel unit corresponds to a red color resist, the first pixel unit comprising a first TFT channel formed between the source and the drain of a first TFT; a second pixel unit corresponds to a green color resist, the second pixel unit comprising a second TFT channel formed between the source and the drain of a second TFT; a third pixel unit corresponds to a blue color resist, the third pixel unit comprising a third TFT channel formed between the source and the drain of a third TFT; and a ratio of width to length of the third TFT channel is greater than that of the second (Continued)

TFT channel; or, the ratio of width to length of the third TFT channel is greater than that of the first TFT channel. This solution is applied to array substrates and display devices.

5 Claims, 4 Drawing Sheets

(51) Int. Cl.
    *G02F 1/1368*     (2006.01)
    *G02F 1/1362*     (2006.01)
    *H01L 27/12*     (2006.01)
    *H01L 29/10*     (2006.01)
    *H01L 29/417*     (2006.01)
    *H01L 29/786*     (2006.01)
    *G02F 1/1335*     (2006.01)

(52) U.S. Cl.
    CPC .... *H01L 27/1222* (2013.01); *G02F 1/133514* (2013.01); *G02F 2001/136222* (2013.01); *G02F 2201/52* (2013.01); *H01L 29/1033* (2013.01); *H01L 29/41733* (2013.01); *H01L 29/78696* (2013.01)

(56) References Cited

U.S. PATENT DOCUMENTS

| | | | |
|---|---|---|---|
| 2009/0033817 A1* | 2/2009 | Ooida | G02F 1/1368 349/43 |
| 2010/0207857 A1* | 8/2010 | Gu | G02F 1/133512 345/88 |
| 2012/0127148 A1* | 5/2012 | Lee | G02F 1/134363 345/212 |
| 2015/0168790 A1* | 6/2015 | Tsuruma | G02F 1/134336 349/43 |

FOREIGN PATENT DOCUMENTS

| | | |
|---|---|---|
| CN | 103176315 | 6/2013 |
| CN | 104656334 | 5/2015 |
| JP | H03153219 | 7/1991 |

OTHER PUBLICATIONS

International Search Report and Written Opinion from PCT/CN15/84336 dated Dec. 16, 2015.

\* cited by examiner

ARRAY SUBSTRATE AND DISPLAY DEVICE

RELATED APPLICATIONS

The present application is the U.S. national phase entry of PCT/CN2015/084336, with an international filling date of Jul. 17, 2015, which claims the benefit of Chinese Patent Application NO. 201510125793.4, filed on Mar. 20, 2015, the entire disclosure of which are incorporated herein by reference

FIELD OF THE INVENTION

The present invention relates to the field of electronic technology, and in particular to an array substrate and a display device.

BACKGROUND ART

A liquid crystal display (LCD) is mainly composed of a thin film transistor (TFT) array substrate and a color filter substrate, and the liquid crystal display after cell alignment of the TFT array substrate and the color filter substrate is provided with pixels R (red), pixels G (green) and pixels B (blue). As shown in FIG. 1, the VT curve (i.e., the curve showing the relationship between a driving voltage and a light transmittance) for pixels R is a; the VT curve for pixels G is b; and the VT curve for pixels B is c.

As can be seen, curve a and curve b substantially coincide, and especially, at the same driving voltage, curve a and curve b almost reach their peaks simultaneously, whereas the peak of curve c falls on the right of the peaks of curve a and curve b. In other words, the light transmittance of pixels B is quite different from those of pixels R and pixels G at the same driving voltage, and accordingly, when a liquid crystal display panel performs displaying function, the difference in the light transmittances of the three pixels R, G and B at the same driving voltage results in color shift of the liquid crystal display, which influences the imaging quality of the liquid crystal display.

SUMMARY

The embodiments of the present invention provide an array substrate and a display device, in order to mitigate the color shift phenomenon occurred in the display device to a certain degree, and improve the imaging quality of the display device.

To achieve the above objectives, the embodiments of the present invention adopt following technical solutions.

In one aspect, an embodiment of the present invention provides an array substrate which comprises a first pixel unit, a second pixel unit and a third pixel unit divided by a gate line and a data line arranged to intersect each other. The first pixel unit can correspond to a red color resist, the first pixel unit comprising a first TFT channel formed between the source and the drain of a first TFT; The second pixel unit can correspond to a green color resist, the second pixel unit comprising a second TFT channel formed between the source and the drain of a second TFT; The third pixel unit can correspond to a blue color resist, the third pixel unit comprising a third TFT channel formed between the source and the drain of a third TFT. And a ratio of width to length of the third TFT channel is greater than that of the second TFT channel; or, the ratio of width to length of the third TFT channel is greater than that of the first TFT channel.

In a possible embodiment, the ratio of width to length of the third TFT channel is greater than that of the second TFT channel; and the ratio of width to length of the third TFT channel is greater than that of the first TFT channel.

In another possible embodiment, the ratio of width to length of the third TFT channel is greater than that of the first TFT channel; and the ratio of width to length of the first TFT channel is greater than that of the second TFT channel.

In an embodiment, the first pixel unit may further comprise at least two first strip electrodes with a first slit provided therebetween; the second pixel unit may further comprise at least two second strip electrodes with a second slit provided therebetween; the third pixel unit may further comprise at least two third strip electrodes with a third slit provided therebetween. And a ratio of the width of the third slit to the width of the third strip electrode can be greater than that of the width of the first slit to the width of the first strip electrode, or the ratio of the width of the third slit to the width of the third strip electrode can be greater than that of the width of the second slit to the width of the second strip electrode.

In another embodiment, the ratio of the width of the third slit to the width of the third strip electrode is greater than that of the width of the first slit to the width of the first strip electrode, and the ratio of the width of the third slit to the width of the third strip electrode is greater than that of the width of the second slit to the width of the second strip electrode.

In yet another implementation, the ratio of the width of the third slit to the width of the third strip electrode is greater than that of the width of the first slit to the width of the first strip electrode, and the ratio of the width of the first slit to the width of the first strip electrode is greater than that of the width of the second slit to the width of the second strip electrode.

According to one embodiment of the present invention, the width of the first TFT channel, the width of the second TFT channel and the width of the third TFT channel can each fall within a range of 5 μm to 35 μm; the length of the first TFT channel, the length of the second TFT channel and the length of the third TFT channel can each fall within a range of 2 μm to 8 μm;

According to one embodiment of the present invention, the width of the first strip electrode, the width of the second strip electrode and the width of the third strip electrode can each fall within a range of 2 μm to 8 μm; the width of the first slit, the width of the second slit and the width of the third slit can each fall within a range of 1 μm to 5 μm.

According to another embodiment of the present invention, the array substrate further comprises a fourth pixel unit. The fourth pixel unit may correspond to a white color resist and comprise a fourth TFT channel formed between the source and the drain of a fourth TFT. A ratio of width to length of the fourth TFT channel may be greater than any one of the ratio of width to length of the first TFT channel, the ratio of width to length of the second TFT channel, and the ratio of width to length of the third TFT channel.

In yet another embodiment, the fourth pixel unit may further comprise at least two fourth strip electrodes and a fourth slit provided therebetween; a ratio of the width of the fourth slit to the width of the fourth strip electrode can be greater than any one of the ratio of the width of the first slit to the width of the first strip electrode, the ratio of the width of the second slit to the width of the second strip electrode and the ratio of the width of the third slit to the width of the third strip electrode.

In a second aspect, the present invention provides a display device which may comprise the array substrate described in any possible implementation according to any embodiments mentioned above.

The embodiments of the present invention provide an array substrate and a display device. In the array substrate, the first pixel unit may correspond to a red color resist, the first pixel unit comprising a first TFT channel formed between the source and the drain of a first TFT; the second pixel unit may correspond to a green color resist, the second pixel unit comprising a second TFT channel formed between the source and the drain of a second TFT; a third pixel unit may correspond to a blue color resist, the third pixel unit comprising a third TFT channel formed between the source and the drain of a third TFT. The ratio of width to length of the third TFT channel is greater than that of the second TFT channel; or, the ratio of width to length of the third TFT channel is greater than that of the first TFT channel. Thus, at the same driving voltage, as the ratio of width to length of the third TFT channel corresponding to the blue color resist (i.e., the aspect ratio of the third TFT channel) is increased, the charge and discharge rates of the storage capacitance in the third TFT is increased, the deflection of the liquid crystal molecules in the third pixel unit is accelerated, and in turn the light transmittance of the third pixel unit corresponding to the blue color resist at this driving voltage is improved, so as to ensure that the three pixels of R, G and B achieve light transmittances as close as possible at the same driving voltage, thereby reducing the color shift and improving the imaging quality of the display device.

BRIEF DESCRIPTION OF DRAWINGS

In order to explain the technical solutions of embodiments of the present invention or in the prior art more clearly, the figures to be used in the description for the embodiments or the prior art shall be briefly introduced as follows. Obviously, the figures in the following description are only some embodiments of the present invention. For those having ordinary skills in the art, on the premise of making no inventive efforts, they can further obtain other figures based on these ones.

DETAILED DESCRIPTION OF EMBODIMENTS

In the following description, specific details such as a specific system structure, an interface, a technique and the like are proposed for explanation, rather than for limitation, so as to facilitate a thorough understanding of the present invention. However, those skilled in the art shall be clear that the present invention can also be implemented in other embodiments without these specific details. In other situations, detailed explanations of well-known devices, circuits and methods are omitted lest unnecessary details should impede description of the present invention.

In addition, terms "first" and "second" are only used for descriptive purpose, and cannot be understood as denoting or implying relative importance, or demonstrating implicitly the number of the indicated technical features. Thereby, features defined with "first" or "second" can comprise explicitly or implicitly one or more features. In the description of the present invention, unless specified otherwise, the meaning of "a plurality of" is two or more.

Figure 2:
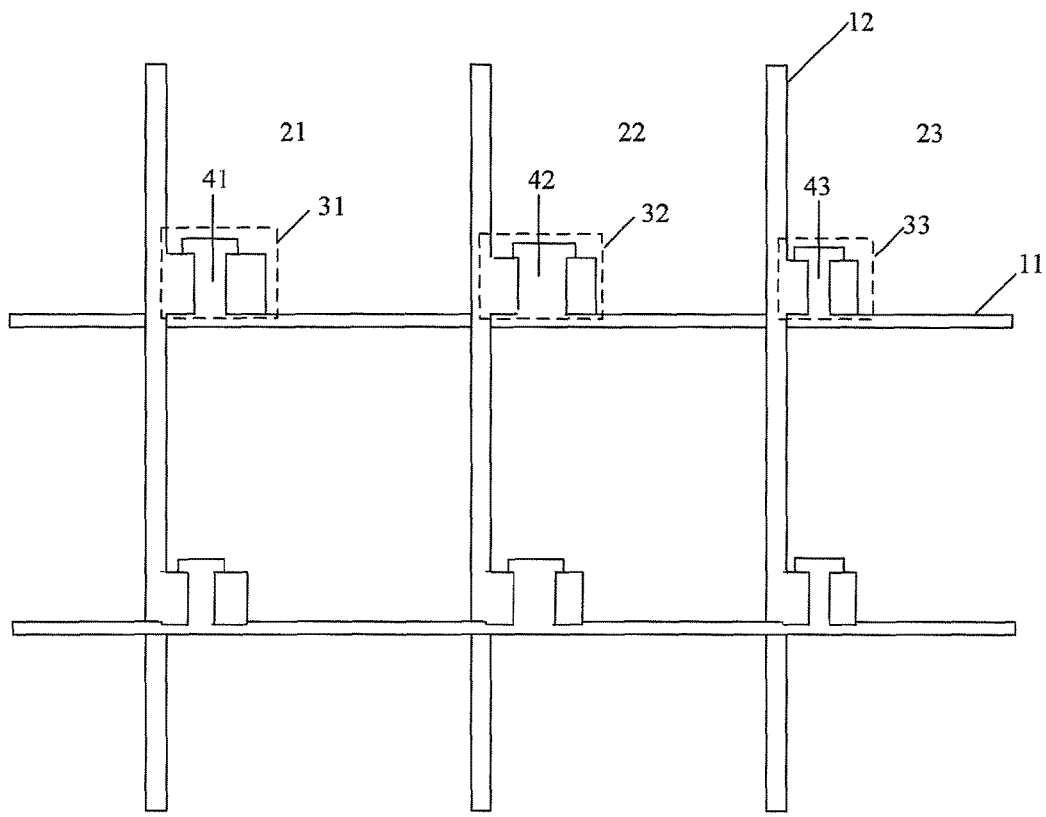
FIG. 2 is a schematic view of an array substrate provided in one embodiment of the present invention.

As shown in FIG. 2, an embodiment of the present invention provides an array substrate comprising a first pixel unit 21, a second pixel unit 22 and a third pixel unit 23 divided by a gate line 11 and a data line 12 arranged to intersect each other.

The first pixel unit 21 can correspond to a red color resist, and comprise a first TFT channel 41 formed between the source and the drain of a first TFT 31; the second pixel unit 22 can correspond to a green color resist and comprise a second TFT channel 42 formed between the source and the drain of a second TFT 32; the third pixel unit 23 can correspond to a blue color resist and comprise a third TFT channel 43 formed between the source and the drain of a third TFT 33. Those skilled in the art can understand that the term "color resist" mentioned herein refers to a material having a transmittance for light of a specific wavelength while blocking light of other wavelengths. For example, the red color resist may only transmit light of the red wavelength but absorb visible light of other wavelengths; the green color resist may only transmit light of the green wavelength but absorb visible light of other wavelengths; the blue color resist may only transmit light of the blue wavelength but absorb visible light of other wavelengths.

Figure 3:
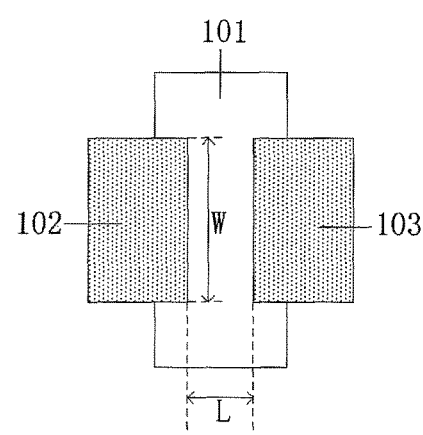
FIG. 3 is a schematic view of a TFT in an array substrate provided in an embodiment of the present invention.

Specifically, as shown in FIG. 3, a schematic structural view of any TFT (e.g., the first TFT 31, the second TFT 32 or the third TFT 33 in FIG. 2) is illustrated, comprising a gate 101, a source 102 and a drain 103. An area limited between the source 102 and the drain 103 is called a TFT channel (e.g., the first TFT channel 41, the second TFT channel 42 or the third TFT channel 43 shown in FIG. 2). The width W of the TFT channel can be the length of opposite surfaces of the source 102 and the drain 103, and the length L of the TFT channel can be the relative distance between the source 102 and the drain 103, so an aspect ratio of the TFT channel can be the ratio of the width W of the TFT channel to the length L of the TFT channel. It should be noted that the TFT in FIG. 3 is only provided as an example for explanation, and the TFT structure in the present application is not limited thereto.

In an embodiment of the present invention, the ratio of width to length of the third TFT channel 43 (i.e., W3/L3) is greater than that of width to length of the second TFT channel 42 (i.e., W2/L2); or the ratio of width to length of the third TFT channel 43 is greater than that of width to length of the first TFT channel 41 (i.e., W1/L1). That is, W3/L3>W2/L2, or W3/L3>W1/L1.

Figure 1:
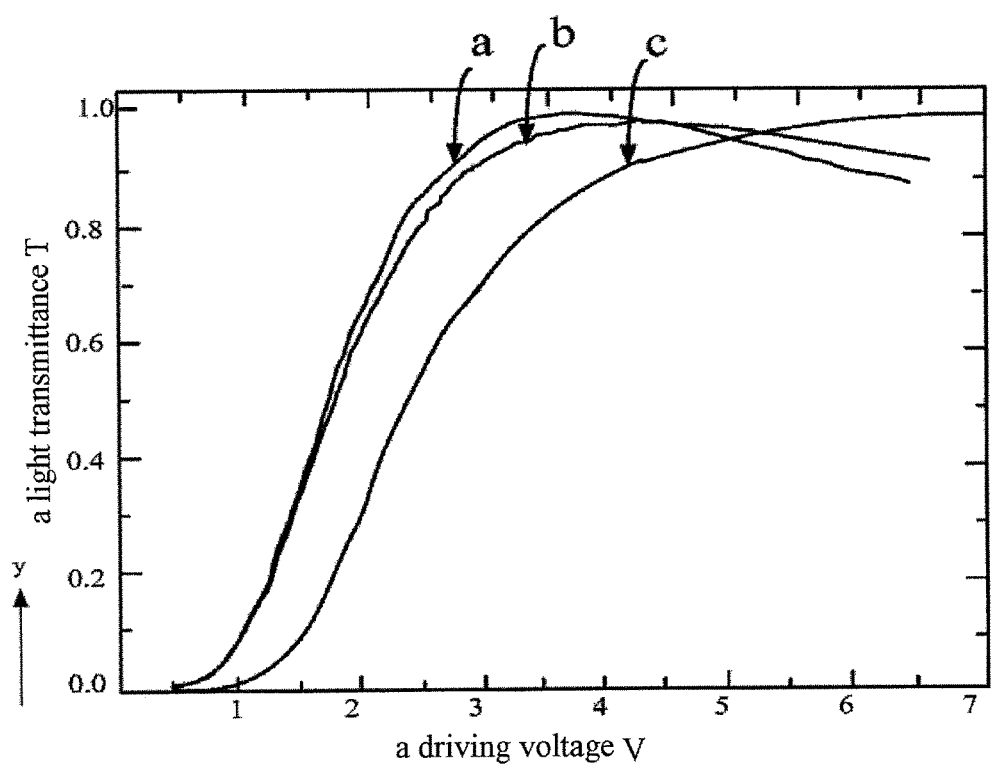
FIG. 1 depicts a curve showing the relationship between a driving voltage and a light transmittance for the three pixels of R, G and B in the prior art.
Figure 4:
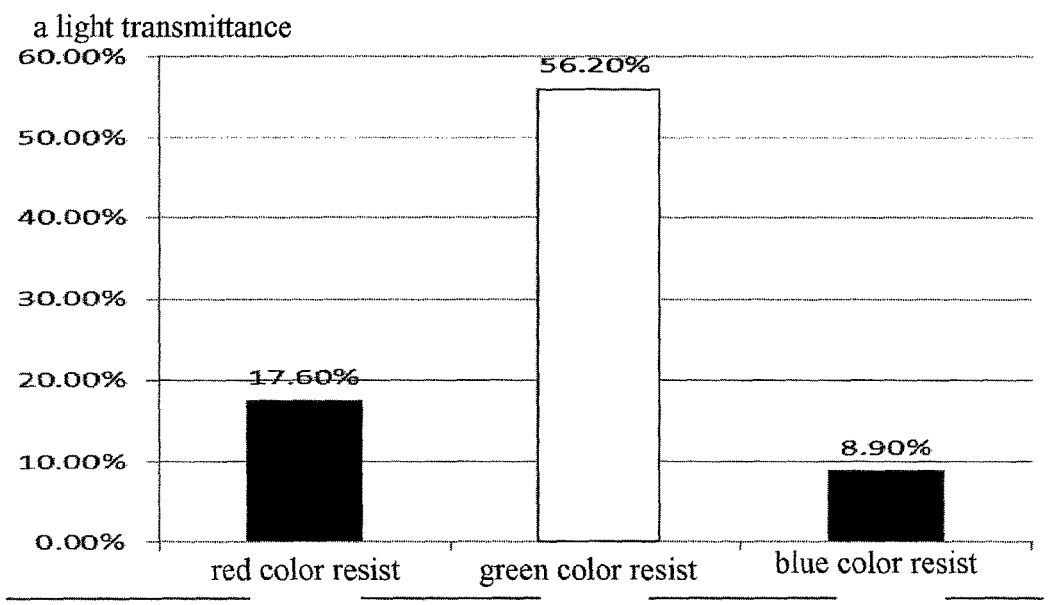
FIG. 4 is a histogram showing the light transmittances for the three color resists of R, G and B.

The operation principle of the array substrate can be described as follows: controlling on and off of each TFT by the gate line 11 and the data line 12, writing an image signal into a corresponding pixel unit, thereby driving liquid crystal molecules in the first pixel unit 21, the second pixel unit 22 and the third pixel unit 23 respectively, and finally achieving display. The first pixel unit 21, the second pixel unit 22 and the third pixel unit 23 may correspond to color resists of the three different colors in the color filter substrate, namely R (red), G (green) and B (blue), respectively. The color resists of different colors have different light transmittances under the same condition. As shown in FIG. 4, given the same color resist value, the transmittance of the blue color resist is lower than those of the red color resist and the green color resist. Therefore, as shown in FIG. 1, at the same driving voltage, the three pixels of R, G and B in the first pixel unit 21, the second pixel unit 22 and the third pixel unit 23 cannot obtain their maximum light transmittances simultaneously, which results in color shift of the display. For this embodiment of the present invention, it is arranged that W3/L3>W2/L2, or W3/L3>W1/L1. And as can be seen from the formula for calculating an on-current as follows, with other parameters unchanged, the on-current increases as the aspect ratio (i.e., W/L) of the TFT channel increases.

$$\text{Ion} = \frac{1}{2}\mu C \frac{W}{L}(Vg - Vt)^2,$$

wherein Ion is the on-current, μ is the carrier mobility, C is the TFT gate capacitance, W is the width of the TFT channel, L is the length of the TFT channel, Vg is the TFT gate forward voltage, and Vt is the TFT threshold voltage.

Figure 5:
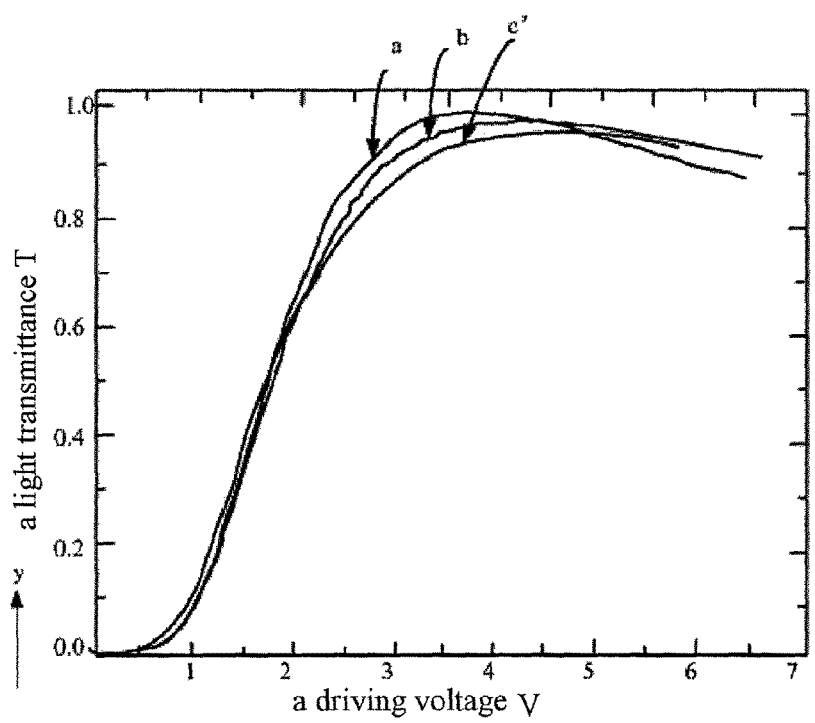
FIG. 5 depicts a curve showing the relationship between the driving voltage and the light transmittance for the three pixels of R, G and B in an embodiment of the present invention.

It can be seen that, in the embodiment of the present invention, by arranging the aspect ratio W3/L3 of the third TFT channel 43 corresponding to the blue color resist to be greater than W2/L2, or to be greater than W1/L1, the on-current in the third pixel unit 23 can be increased, such that the charge and discharge rates of the storage capacitance in the third TFT 33 are increased and that the deflection of the liquid crystal molecules in the third pixel unit 23 is accelerated, which in turn the light transmittance of the blue pixels in the third pixel unit 23 at this driving voltage is improved. Accordingly, as shown in FIG. 5, when the three pixels of R, G and B are driven by the same driving voltage, the VT curve c' for pixels B generally coincides with the VT curve a for pixels R and the VT curve b for pixels G, ensuring that the three pixels of R, G and B achieve their maximum light transmittances simultaneously, thereby reducing the color shift.

Obviously, there can be many different ways for achieving W3/L3>W2/L2, or W3/L3>W1/L1. For example, as shown in FIG. 2, in case the widths of the TFT channels are arranged to be the same (i.e., W1=W2=W3), the length L3 of the third TFT channel 43 can be reduced such that L3<L2, or L3<L1.

Alternatively, in case the lengths of the TFT channels are arranged to be the same (i.e., L1=L2=L3), the width W3 of the third TFT channel 43 can be increased such that W3>W2, or W3>W1.

Furthermore, the first pixel unit 21, the second pixel unit 22 and the third pixel unit 23 in the array substrate of the embodiment of the present invention may all comprise a pixel electrode (connected with the drain of the TFT in the pixel units), and of course, they may further comprise a common electrode (connected with a common electrode line for forming together with the pixel electrode an electric field for driving the liquid crystals). Whether it is a pixel electrode or a common electrode, the electrode may comprise at least two strip electrodes.

Figure 6:
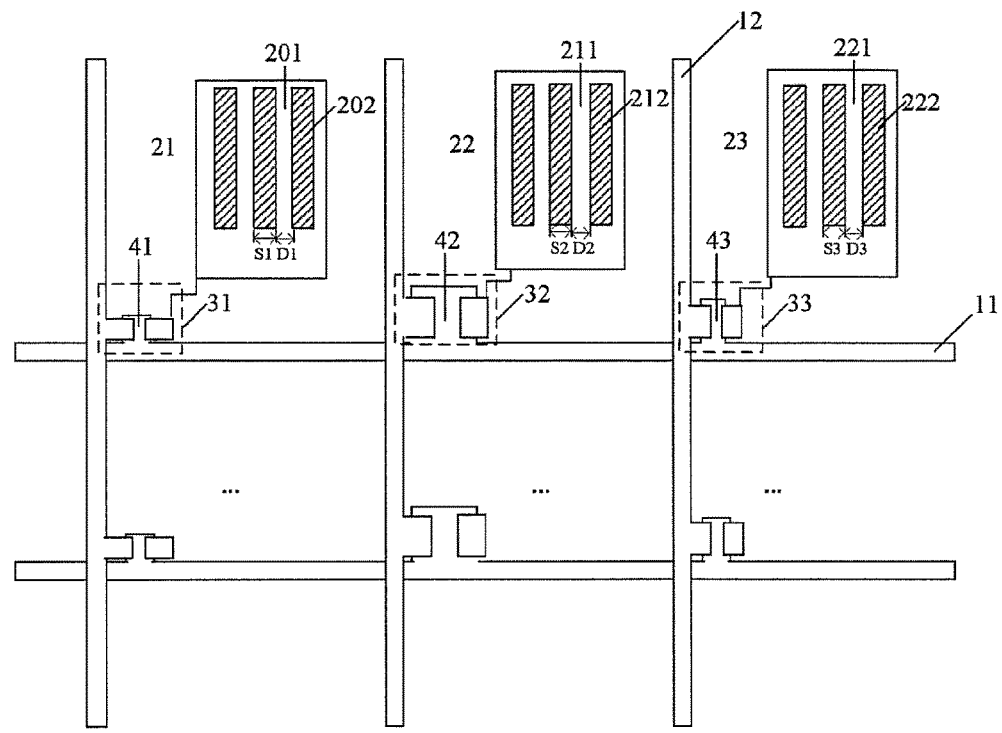
FIG. 6 is a schematic view of an array substrate provided in another embodiment of the present invention.

To take the pixel electrode of strip electrodes as an example, in the array substrate provided in an embodiment as shown in FIG. 6, the first pixel unit 21 may further comprise at least two first strip electrodes 202 and a first slit 201 provided therebetween; the second pixel unit 22 may further comprise at least two second strip electrodes 212 and a second slit 211 provided therebetween; the third pixel unit 23 may further comprise at least two third strip electrodes 222 and a third slit 221 provided therebetween.

It should be noted that the first strip electrodes 202, the second strip electrodes 212 and the third strip electrodes 22 can also be common electrodes, to which no limitation shall be made in the present invention.

A ratio of the width D3 of the third slit to the width S3 of the third strip electrode (i.e. D3/S3) can be greater than that of the width D1 of the first slit to the width S1 of the first strip electrode (i.e., D1/S1), or the ratio of the width D3 of the third slit to the width S3 of the third strip electrode (i.e. D3/S3) can be greater than that of the width D2 of the second slit to the width S2 of the second strip electrode (i.e. D2/S2).

Still as shown in FIG. 5, when D3/S3 is increased, the VT curve for pixels B in the third pixel unit 23 can be shifted leftwards to obtain curve c' such that curve a, curve b and curve c' nearly coincide. In other words, curve a, curve b and curve c' essentially reach their peaks simultaneously at the same driving voltage (i.e., at the same driving voltage, the three pixels of R, G and B obtain their maximum light transmittances simultaneously).

Therefore, the array substrate provided in the embodiment of the invention can decrease an absolute value of a difference between the corresponding driving voltage at which pixel B obtain its maximum light transmittance and the corresponding driving voltage at which pixel G obtain its maximum light transmittance by arranging D3/S3>D2/S2, or decrease an absolute value of a difference between the corresponding driving voltage at which pixel B obtain its maximum light transmittance and the corresponding driving voltage at which pixel R obtain its maximum light transmittance by arranging D3/S3>D1/S1. Accordingly, at the same driving voltage, pixels R, pixels G and pixels B can achieve their maximum light transmittances simultaneously, which may reduce or eliminate the color shift of a liquid crystal display panel without increasing the complexity of the array substrate, and as a result the process is simplified and the production yield is improved.

Obviously, there can be many different ways for arranging D3/S3>D2/S2, or D3/S3>D1/S1. For example, in case the widths of the strip electrodes are arranged to be the same (i.e., S1=S2=S3), the width D3 of the third slit is increased such that D3>D2, or D3>D1.

Alternatively, in case the widths of the slits are arranged to be the same (i.e., D1=D2=D3), the width S3 of the third strip electrode is reduced such that S3<S2, or S3<S1.

In addition, it should be noted that the arrangement of the first strip electrodes 202, the second strip electrodes 212 and the third strip electrodes 222 as shown in FIG. 6 are only provided as examples for exemplary explanations. Specifically, the first strip electrodes 202, the second strip electrodes 212 and the third strip electrodes 222 can be parallel to each other, wherein the first strip electrodes 202, the second strip electrodes 212 and the third strip electrodes 222 can be all in parallel with the data line 12. Alternatively, the first strip electrodes 202, the second strip electrodes 212 and the third strip electrodes 222 can be all in parallel with the gate line 11. Alternatively, extension lines of the first strip electrodes 202, the second strip electrodes 212 and the third strip electrodes 222 can all intersect with the gate line 11 and the data line 12.

Alternatively, for the array substrate provided in another embodiment of the present invention, the ratio of width to length of the third TFT channel 43 can be arranged to be greater than that of the second TFT channel 42; and moreover, the ratio of width to length of the third TFT channel 43 is greater than that of the first TFT channel 41, i.e., W3/L3>W2/L2, and W3/L3>W1/L1.

Since the light transmittance of the blue color resist corresponding to the third pixel unit 23 is not only lower than that of the red color resist corresponding to the first pixel unit 21, but also lower than that of the green color resist corresponding to the second pixel unit 22, by arranging W3/L3>W2/L2, and W3/L3>W1/L1, the light transmittance of the blue pixels can be made greater than that of the red pixels while greater than that of the green pixels, which further ensures that the three pixels of R, G and B obtain their maximum light transmittances simultaneously at the same driving voltage.

Correspondingly, the ratio of the width D3 of the third slit to the width S3 of the third strip electrode can be arranged to be greater than that of the width D1 of the first slit to the width S1 of the first strip electrode, and the ratio of the width D3 of the third slit to the width S3 of the third strip electrode can be set to be greater than that of the width D2 of the second slit to the width S2 of the second strip electrode, i.e., D3/S3>D1/S1, and D3/S3>D2/S2.

In another embodiment, since the light transmittance of the blue color resist corresponding to the third pixel unit 23 is lower than that of the red color resist corresponding to the first pixel unit 21, and the light transmittance of the red color resist corresponding to the first pixel unit 21 is lower than that of the green color resist corresponding to the second pixel unit 22, the ratio of width to length of the third TFT channel 43 can be set to be greater than that of the first TFT channel 41; and the ratio of width to length of the first TFT channel 41 can be set to be greater than that of the second TFT channel 42, i.e., W3/L3>W1/L1>W2/L2, such that the light transmittance of the blue pixels is greater than that of the red pixels, and that the light transmittance of the red pixels is greater than that of the green pixels, so as to further ensure that the three pixels of R, G and B obtain their maximum light transmittances simultaneously at the same driving voltage.

Correspondingly, the ratio of the width D3 of the third slit to the width S3 of the third strip electrode can be set to be greater than that of the width D1 of the first slit to the width S1 of the first strip electrode, and the ratio of the width D1 of the first slit to the width S1 of the first strip electrode can be set to be greater than that of the width D2 of the second slit to the width S2 of the second strip electrode, i.e., D3/S3>D1/S1>D2/S2.

Exemplarily, the width of the first TFT channel 41, the width of the second TFT channel 42 and the width of the third TFT channel 43 can each fall within a range of 5 μm to 35 μm; the length of the first TFT channel 41, the length of the second TFT channel 42 and the length of the third TFT channel 43 can each fall within a range of 2 μm to 8 μm.

The width of the first strip electrode, the width of the second strip electrode and the width of the third strip electrode can each fall within a range of 2 μm to 8 μm; and the width of the first slit, the width of the second slit and the width of the third slit can each fall within a range of 1 μm to 5 μm.

For example, the aspect ratio W3/L3 of the third TFT channel 43 may be set as 14 μm/5 μm, the aspect ratio W1/L1 of the first TFT channel 41 may be set as 12 μm/5 μm, and the aspect ratio W2/L2 of the second TFT channel 42 may be set as 10 μm/5 μm. It can be seen that, since W3/L3>W1/L1>W2/L2, the charge and discharge rates of the storage capacitance in the third TFT 33 can be increased, the deflection of the liquid crystal molecules in the third pixel unit 23 can be accelerated, and in turn the light transmittance of the blue pixels in the third pixel unit 23 at this driving voltage is improved. In this way, as shown in FIG. 5, when the three pixels of R, G and B are driven by the same driving voltage, the VT curve c' for pixel B essentially coincides with the VT curve a for pixel R and the VT curve b for pixel G, ensuring that the three pixels of R, G and B achieve their maximum light transmittances simultaneously, thereby reducing the color shift.

Figure 7:
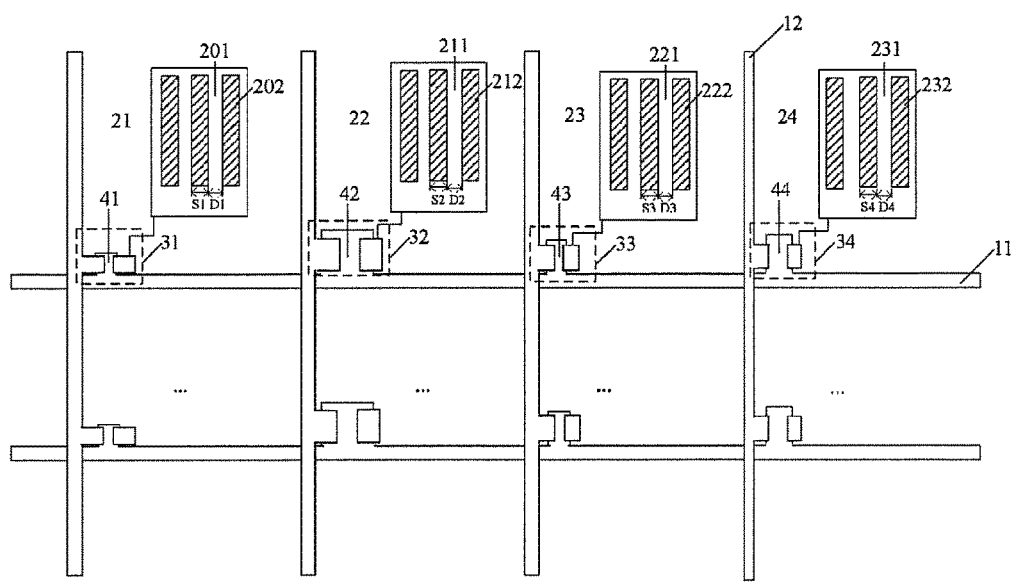
FIG. 7 is a schematic view of an array substrate provided in yet another embodiment of the present invention.

Furthermore, as shown in FIG. 7, the array substrate provided in another embodiment of the present invention may further comprise a fourth pixel unit 24. The fourth pixel unit 24 may correspond to a white color resist and may further comprise at least two fourth strip electrodes 232, a fourth slit 231 provided therebetween, and a fourth TFT channel 44 formed between the source and the drain of a fourth TFT 34;

As the white pixels corresponding to the fourth pixel unit 24 can be used for increasing the brightness of the display image during performing displaying function together with the three pixels of R, G and B, the ratio of width to length of the fourth TFT channel 44 in the fourth pixel unit 24 (i.e., W4/L4) can be any value, and the ratio of the width of the fourth slit to the width of the fourth strip electrode (i.e., D4/S4) can be any value too. For example, the width of the fourth TFT channel 44 may fall within a range of 5 μm to 35 μm; the length of the fourth TFT channel 44 may fall within a range of 2 μm to 8 μm; the width of the fourth strip electrode may fall within a range of 2 μm to 8 μm; and the width of the fourth slit may fall within a range of 1 μm to 5 μm.

In one embodiment, the ratio of width to length of the fourth TFT channel 44 (i.e., W4/L4) may be set to be greater than any one of the ratio of width to length of the first TFT channel 41 (i.e., W1/L1), the ratio of width to length of the second TFT channel 42 (i.e., W2/L2), and the ratio of width to length of the third TFT channel 43 (i.e., W3/L3). In this way, the characteristics of the TFT corresponding to the fourth pixel unit can be further optimized, which facilitates promotion of the charge efficiency of this pixel unit and thereby improves the transmittance for the white pixels.

Correspondingly, the ratio of the width of the fourth slit to the width of the fourth strip electrode (i.e., D4/S4) can be set to be greater than any one of the ratio of the width of the first slit to the width of the first strip electrode (i.e., D1/S1), the ratio of the width of the second slit to the width of the second strip electrode (i.e., D2/S2), and the ratio of the width of the third slit to the width of the third strip electrode (i.e., D3/S3). Thus, the transverse electric field and the optical rotation efficiency of the liquid crystals driven by the electric field can be further optimized, which helps to achieve a display image with higher brightness. Therefore, for a predetermined brightness of a display device, the predetermined brightness can still be achieved in case the brightness of the backlight source is reduced, which facilitates energy consumption reduction of the display device.

Another embodiment of the present invention provides a display device which comprises any one of the array substrates mentioned above. The display device can be any product or component having a displaying function, such as a liquid crystal panel, an electronic paper, an OLED panel, a mobile phone, a tablet computer, a television, a display, a notebook computer, a digital photo frame, a navigator and the like.

The embodiments of the present invention provide an array substrate and a display device. A first pixel unit in the array substrate may correspond to a red color resist, the first pixel unit comprising a first TFT channel formed between the source and the drain of a first TFT; a second pixel unit may correspond to a green color resist, the second pixel unit comprising a second TFT channel formed between the source and the drain of a second TFT; a third pixel unit may correspond to a blue color resist, the third pixel unit comprising a third TFT channel formed between the source and the drain of a third TFT. The ratio of width to length of the third TFT channel is greater than that of the second TFT channel; or, the ratio of width to length of the third TFT channel is greater than that of the first TFT channel. In this way, at the same driving voltage, as the ratio of width to length of the third TFT channel corresponding to the blue color resist (i.e., the aspect ratio of the third TFT channel) is increased, the charge and discharge rates of the storage capacitance in the third TFT can be increased, the deflection of the liquid crystal molecules in the third pixel unit can be accelerated, and in turn the light transmittance of the third pixel unit corresponding to the blue color resist at this driving voltage is improved, so as to ensure that the three pixels of R, G and B achieve light transmittances as close as possible at the same driving voltage, thereby reducing the color shift and improving the imaging quality of the display device.

In the description of this specification, specific features, structures, materials or characteristics can be combined in any one or more of the embodiments or examples in a suitable manner.

What is mentioned above is only specific embodiments of the present invention, but the protection scope of the present invention shall not be limited thereto. Any modification or substitution easily conceivable for the skilled person who is familiar with this art within the technical disclosure of the present invention shall fall within the protection scope of the present invention. Therefore, the protection scope of the present invention should be subject to the protection scope of the claims.

The invention claimed is:

1. An array substrate comprising:
a first pixel unit, a second pixel unit, and a third pixel unit, which are divided by a gate line and a data line arranged to intersect each other,
wherein the first pixel unit corresponds to a red color resist, the second pixel unit corresponds to a green color resist, the third pixel unit corresponds to a blue color resist;
wherein
the first pixel unit further comprises at least two first strip electrodes that are substantially parallel to each other and evenly distributed within the first pixel unit, the first strip electrodes are spaced apart from each other at a first slit;
the second pixel unit further comprises at least two second strip electrodes that are substantially parallel to each other and evenly distributed within the second pixel unit, the second strip electrodes are spaced apart from each other at a second slit;
the third pixel unit further comprises at least two third strip electrodes that are substantially parallel to each other and evenly distributed within the third pixel unit, the third strip electrodes are spaced apart from each other at a third slit;
wherein, a ratio of a width of the third slit to a width of each one of the third strip electrodes is greater than that of a width of the first slit to a width of each one of the first strip electrodes, or the ratio of a width of the third slit to a width of each one of the third strip electrodes is greater than that of a width of the second slit to a width of each one of the second strip electrodes.

2. The array substrate according to claim 1, wherein
the ratio of the width of the third slit to the width of each one of the third strip electrodes is greater than that of the width of the first slit to the width of each one of the first strip electrodes, and
the ratio of the width of the third slit to the width of each one of the third strip electrodes is greater than that of the width of the second slit to the width of each one of the second strip electrodes.

3. The array substrate according to claim 1, wherein
the ratio of the width of the third slit to the width of each one of the third strip electrodes is greater than that of the width of the first slit to the width of each one of the first strip electrodes, and
the ratio of the width of the first slit to the width of each one of the first strip electrodes is greater than that of the width of the second slit to the width of each one of the second strip electrodes.

4. The array substrate according to claim 1, wherein
the width of the first strip electrode, the width of the second strip electrode and the width of the third strip electrode each falls within a range of 2 μm to 8 μm;
the width of the first slit, the width of the second slit and the width of the third slit each falls within a range of 1 μm to 5 μm.

5. A display device comprising:
an array substrate, the array substrate comprising a first pixel unit, a second pixel unit and a third pixel unit, which are divided by a gate line and a data line arranged to intersect each other,
wherein the first pixel unit corresponds to a red color resist;
wherein the second pixel unit corresponds to a green color resist;
wherein the third pixel unit corresponds to a blue color resist
wherein
the first pixel unit further comprises at least two first strip electrodes that are substantially parallel to each other and evenly distributed within the first pixel unit, the first strip electrodes are spaced apart from each other at a first slit;
the second pixel unit further comprises at least two second strip electrodes that are substantially parallel to each other and evenly distributed within the second pixel unit, the second strip electrodes are spaced apart from each other at a second slit;
the third pixel unit further comprises at least two third strip electrodes that are substantially parallel to each other and evenly distributed within the third pixel unit, the third strip electrodes are spaced apart from each other at a third slit;
wherein, a ratio of a width of the third slit to a width of each one of the third strip electrodes is greater than that of a width of the first slit to a width of each one of the first strip electrodes, or the ratio of a width of the third slit to a width of each one of the third strip electrodes is greater than that of a width of the second slit to a width of each one of the second strip electrodes.

* * * * *